US012640196B2

(12) United States Patent
Liu et al.

(10) Patent No.: US 12,640,196 B2
(45) Date of Patent: May 26, 2026

(54) MEMORY DEVICE, WRITE ASSIST CIRCUIT, AND METHOD

(71) Applicants: TAIWAN SEMICONDUCTOR MANUFACTURING COMPANY, LTD, Hsinchu (TW); TSMC NANJING COMPANY, LIMITED, Nanjing (CN)

(72) Inventors: Jun-Cheng Liu, Hsinchu (TW); Zhi-Min Zhu, Hisnchu (TW); Chien-Yu Huang, Hsinchu (TW); Cheng Hung Lee, Hsinchu (TW); Hung-Jen Liao, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 133 days.

(21) Appl. No.: 18/524,761

(22) Filed: Nov. 30, 2023

(65) Prior Publication Data

US 2025/0166698 A1      May 22, 2025

(30) Foreign Application Priority Data

Nov. 20, 2023    (CN) .......................... 202311555071.3

(51) Int. Cl.
*G11C 11/419*          (2006.01)

(52) U.S. Cl.
CPC .................................. *G11C 11/419* (2013.01)

(58) Field of Classification Search
CPC ..................................................... G11C 11/419
USPC ......................................................... 365/154
See application file for complete search history.

(56) References Cited

U.S. PATENT DOCUMENTS

| | | | |
|---|---|---|---|
| 12,243,585 B1 * | 3/2025 | M Siddiqui | ........... G11C 11/419 |
| 2007/0268738 A1 * | 11/2007 | Heinrich-Barna | .... G11C 11/412 365/149 |
| 2014/0340977 A1 * | 11/2014 | Karl | ....................... G11C 5/147 365/227 |
| 2023/0335186 A1 | 10/2023 | Chung et al. | |

FOREIGN PATENT DOCUMENTS

TW            201909180          3/2019

* cited by examiner

*Primary Examiner* — Sung Il Cho
(74) *Attorney, Agent, or Firm* — Hauptman Ham, LLP

(57) ABSTRACT

A memory device includes a memory cell in a first power domain of a first power supply voltage, a bit line coupled to the memory cell, and a write assist circuit. The write assist circuit includes an input, an output electrically couplable to the bit line in a write operation of the memory cell, an input circuit electrically coupled to the input, and an output circuit electrically coupled between the input circuit and the output. The input circuit is in a second power domain of a second power supply voltage different from the first power supply voltage, and the output circuit is in the first power domain.

20 Claims, 11 Drawing Sheets applying an access voltage corresponding to a first power supply voltage to the word line

505 in response to an enable signal corresponding to a second power supply voltage different from the first power supply voltage, pulling down a bit line voltage on the bit line by a voltage drop corresponding to the first power supply voltage

515

500

MEMORY DEVICE, WRITE ASSIST CIRCUIT, AND METHOD

BACKGROUND

Memories are components of integrated circuit (IC) devices and are configured to store data and/or applications to be processed and/or executed by the IC devices. As IC devices are reduced in size, operating voltages of the IC devices and the associated memories are also reduced. When operating voltages of memories are reduced, there are considerations regarding reliability of read operations and/or write operations performed in the memories at the reduced operating voltages. Write assist circuits are developed to ensure that write operations are reliably performed in memories even at reduced operating voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
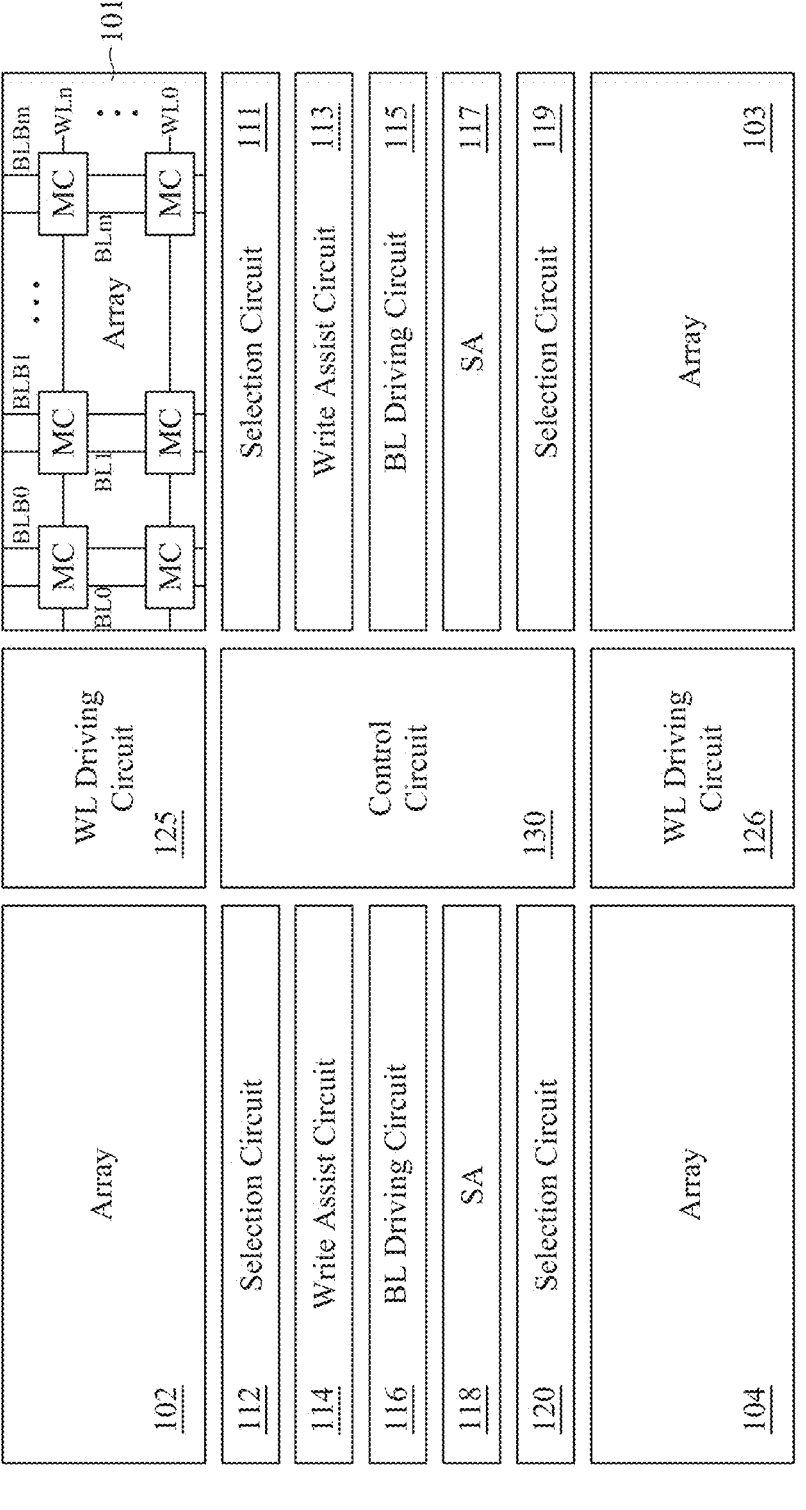
FIG. 1 is a schematic block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a memory device comprises several power domains configured to provide different power supply voltages for different circuits and/or different purposes. For example, the memory device comprises a memory array and peripheral circuitry. The memory array is in, or powered by, a first power domain of a first power supply voltage, e.g., VDDM. The peripheral circuitry is at least partially in, or powered by, a second power domain of a second power supply voltage, e.g., VDD, different from VDDM. In at least one embodiment, the memory device comprises independent VDDM and VDD power supplies, or power sources, each configured to provide the corresponding VDDM or VDD independently from the other. This configuration is sometimes referred to as an array dual rail (ADR) configuration.

In at least one embodiment, a memory device comprises a write assist circuit which includes an output circuit in the first power domain of VDDM (hereinafter referred to as the VDDM power domain), and an input circuit in the second power domain of VDD (hereinafter referred to as the VDD power domain). The write assist circuit is configured to receive, through the input circuit, an enable signal in the VDD power domain of the peripheral circuitry, for enabling the write assist circuit in a write operation of one or more memory cells of the memory array. In response to the enable signal, the write assist circuit is configured to generate, through the output circuit, a write assist voltage for assisting the write operation. In at least one embodiment, because the output circuit is in the same VDDM power domain as the memory array, the write assist voltage corresponds to VDDM. As a result, it is possible, in one or more embodiments, to avoid or mitigate one or more potential issues including, but not limited to, weak write assist ability, reduced memory cell (or bitcell) reliability, or the like. In some embodiments, it is possible to achieve one or more effects including, but not limited to, improved power consumption, reliable write operations at low operating voltages, advantageous power tracking between the write assist voltage and VDDM, or the like.

FIG. 1 is a schematic block diagram of a memory device 100, in accordance with some embodiments. In at least one embodiment, a memory device is an individual IC device. In some embodiments, a memory device is included as a part of a larger IC device which comprises circuitry other than the memory device for other functionalities.

The memory device 100 comprises memory arrays 101-104, selection circuits 111, 112, 119, 120, write assist circuit 113, 114, bit line (BL) driving circuits 115, 116, sense amplifiers (SAs) 117, 118, word line (WL) driving circuits 125, 126, and a control circuit 130. In some embodiments, except for the memory arrays 101-104, the remaining circuits and components of the memory device 100 are sometimes collectively referred to as a memory controller, or peripheral circuitry.

The memory arrays 101-104 are similarly configured. The memory array 101 is described in detail herein. The description of the memory array 101 is applicable to the memory arrays 102-104. The memory array 101 comprises a plurality of memory cells MC, a plurality of word lines WL0 to WLn, and a plurality of pairs of bit lines BL0/BLB0, BL1/BLB1 to BLm/BLBm, where n and m are natural numbers. In the memory array 101, the memory cells MC are arranged in a plurality of columns corresponding to the bit lines, and a plurality of rows corresponding to the word lines. Columns and rows in a memory array are sometimes referred to as memory columns and memory rows. Each memory cell MC is electrically coupled to a corresponding word line and a corresponding pair of bit lines. In some embodiments, each memory cell MC is electrically coupled to more than one word lines. In some embodiments, each memory cell MC is electrically coupled to more than one pairs of bit lines. In some embodiments, each memory cell MC is electrically coupled to a bit line, instead of a pair of bit lines, i.e., the bit lines BLB0, BLB1 to BLBm are omitted. The word lines are configured for transmitting addresses of memory cells MC to be accessed in a read operation or a write operation. The word lines are sometimes referred to as "address lines." The bit lines are configured for transmitting data read from, or data to be written into, the memory cells MC indicated by the addresses on the corresponding word lines. The bit lines are sometimes referred to as "data lines." Various numbers of word lines and/or bit lines in the memory array 101 are within the scope of various embodiments.

The selection circuit 111 controllably couples the write assist circuit 113, bit line driving circuit 115, sense amplifier 117 to the memory array 101 by the bit lines of the memory array 101. The selection circuit 119 controllably couples the write assist circuit 113, bit line driving circuit 115, sense amplifier 117 to the memory array 103 by the bit lines of the memory array 103. The selection circuit 112 controllably couples the write assist circuit 114, bit line driving circuit 116, sense amplifier 118 to the memory array 102 by the bit lines of the memory array 102. The selection circuit 120 controllably couples the write assist circuit 114, bit line driving circuit 116, sense amplifier 118 to the memory array 104 by the bit lines of the memory array 104. The word line driving circuit 125 is electrically coupled to the memory arrays 101-102 by the word lines of the memory arrays 101-102. The word line driving circuit 126 is electrically coupled to the memory arrays 103-104 by the word lines of the memory arrays 103-104.

In some embodiments, the control circuit 130 is configured to decode a row address of one or more memory cells MC selected to be accessed, and to cause the word line driving circuits 125, 126 to supply a set of access voltages to the selected word line(s) corresponding to the decoded row address.

In some embodiments, the control circuit 130 is configured to decode a column address of one or more memory cells MC selected to be accessed, and to accordingly control the selection circuits 111, 112, 119, 120 to electrically couple one or more of the write assist circuit 113, 114, bit line driving circuits 115, 116, sense amplifiers 117, 118, to the selected bit line(s) corresponding to the decoded column address. The control circuit 130 is further configured to control one or more of the write assist circuit 113, 114, bit line driving circuits 115, 116, sense amplifiers 117, 118 to supply voltages to, or to detect voltages on, the selected bit lines in read operations or write operations as described herein.

For example, in a read operation of one or more memory cells MC in the memory array 101, the word line driving circuit 125 supplies, under control by the control circuit 130, access voltages to the corresponding selected word line(s). The selection circuit 111 electrically couples, under control by the control circuit 130, the corresponding selected bit line(s) to the sense amplifier 117. The sense amplifier 117 is configured to sense, and output, data read from the accessed memory cells MC and retrieved through the selected bit line(s). In some embodiments, before data sensing by the sense amplifier 117, the selected bit line(s) is/are pre-charged by a pre-charge circuit (not shown) in the memory controller. In at least one embodiment, the bit line driving circuit 115 is configured as the pre-charge circuit.

For another example, in a write operation of one or more memory cells MC in the memory array 101, the word line driving circuit 125 supplies, under control by the control circuit 130, access voltages to the corresponding selected word line(s). The selection circuit 111 electrically couples, under control by the control circuit 130, the corresponding selected bit line(s) to the write assist circuit 113 and the bit line driving circuit 115. The bit line driving circuit 115 supplies a write voltage whereas the write assist circuit 113 supplies a write assist voltage to the selected bit line(s) to write data to the accessed memory cells MC, as described in further detail herein.

In at least one embodiment, the memory controller further includes one or more address latches, address decoders, pulse generators, read/write controls, clock generators for providing clock signals for various components of the memory device 100, input/output (I/O) circuits for data exchange with external devices, and/or sub-controllers for controlling various operations in the memory device 100. The described memory device configuration is an example, and other memory device configurations are within the scopes of various embodiments.

In at least one embodiment, the memory device 100 comprises an ADR configuration having a first power domain of a first power supply voltage, and a second power domain of a second power supply voltage different from the first power supply voltage. For example, as described herein, the first power supply voltage is VDDM and the second power supply voltage is VDD. VDDM and VDD are positive power supply voltages. In at least one embodiment, VDDM is higher than VDD. In some embodiments, VDDM is lower than VDD. Whether VDDM is higher, or lower, than VDD is a design consideration depending on various factors including, but not limited to, applications, power requirements, speed requirements, or the like.

The memory arrays 101-104 are in, or powered by, the first power domain, or VDDM power domain. The word line driving circuits 125, 126 are also in, or powered by, the VDDM power domain. In some embodiments, being in or powered by the VDDM power domain means that the memory cells MC and word line driving circuits 125, 126 are electrically coupled to a VDDM power supply, and/or one or more VDDM power rails, and/or one or more nodes having the voltage VDDM. In other words, the operating voltage of the memory cells MC and word line driving circuits 125, 126 is VDDM.

Some parts, circuits or components of the memory controller are in, or powered by, the second power domain, or VDD power domain. In some embodiments, being in or powered by the VDD power domain means that such parts, circuits or components are electrically coupled to a VDD power supply, and/or one or more VDD power rails, and/or one or more nodes having the voltage VDD. In other words, the operating voltage of such parts, circuits or components is VDD. In at least one embodiment, the pre-charge circuits, sense amplifiers 117, 118, and I/O circuits for receiving data to be written to or read from the memory arrays 101-104 are in the VDD power domain.

Some parts, circuits or components of the memory controller are configurable in either the VDDM power domain or VDD power domain. For example, as described herein, the selection circuits 111, 112, 119, 120, or parts thereof, are configured to be in the VDD power domain in some applications or memory devices, and are configured to be in the VDDM power domain in other applications or memory devices. For another example, as described herein, a part of the write assist circuits 113, 114 is configured to be in the VDD power domain in some applications or memory devices, and is configured to be in the VDDM power domain in other applications or memory devices. In some embodiments, the bit line driving circuits 115, 116 are configured to be in the VDD power domain in some applications or memory devices, and are configured to be in the VDDM power domain in other applications or memory devices. In at least one embodiment, when a part, circuit or component of the memory controller is configurable in either the VDDM power domain or VDD power domain, whether such part, circuit or component is actually configured to be in the VDDM power domain or to be in VDD power domain is a design consideration depending on various factors including, but not limited to, one or more power-performance-area (PPA) requirements, dual rail voltage supporting range, or the like.

The write assist circuits 113, 114 are configured to operate in both the VDDM power domain and the VDD power domain, for example, as described in further detail herein.

Figure 2A:
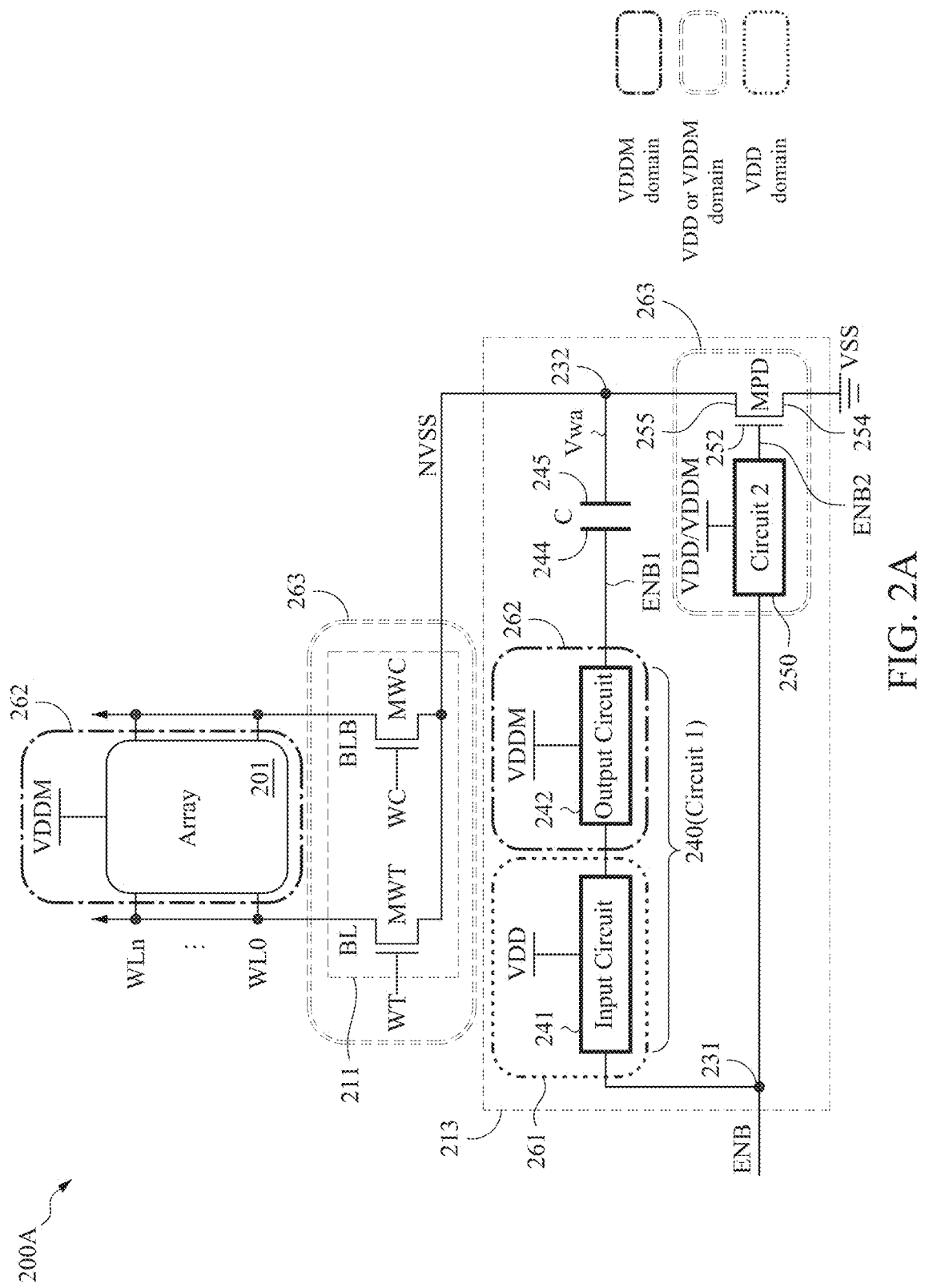
FIGS. 2A-2C are schematic circuit diagrams of various memory devices, in accordance with some embodiments.

FIG. 2A is a schematic circuit diagram of a memory device 200A, in accordance with some embodiments. In some embodiments, the memory device 200A corresponds to the memory device 100.

The memory device 200A comprises a memory array 201, a selection circuit 211, and a write assist circuit 213. In some embodiments, the memory array 201, selection circuit 211, and write assist circuit 213 correspond to the memory array 101, selection circuit 111, and write assist circuit 113. The selection circuit 211 and write assist circuit 213 are parts of a memory controller of the memory device 200A. In some embodiments, the memory controller of the memory device 200A corresponds to the memory controller of the memory device 100, and comprises one or more further components (not shown) as described with respect to FIG. 1. For simplicity, a pair of bit lines BL/BLB of the memory array 201 is illustrated in FIG. 2A, and the description herein is provided for memory cells in the memory column corresponding to the pair of bit lines BL/BLB. In some embodiments, the pair of bit lines BL/BLB corresponds to any pair of bit lines in the memory array 101.

The selection circuit 211 comprises a pair of switches MWT, MWC correspondingly between a node or rail NVSS (negative VSS) and the pair of bit lines BL/BLB. In the example configuration in FIG. 2A, each of the switches MWT, MWC is an N-type transistor. In some embodiments, at least one of the switches MWT, MWC is a P-type transistor. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. For simplicity, transistors specifically described herein include NMOS and PMOS transistors. The switch, or transistor, MWT is configured to be turned ON in response to a control signal WT (write true) from a control circuit (not shown) corresponding to the control circuit 130. The switch, or transistor, MWC is configured to be turned ON in response to a control signal WC (write compliment) from the control circuit. The control circuit is configured to control the selection circuit 211 to electrically couple one of the pair of bit lines BL/BLB to rail NVSS at a time. For example, when the transistor MWT is turned ON to electrically couple the bit line BL to the rail NVSS, the transistor MWC is turned OFF to electrically isolate the bit line BLB from the rail NVSS. The bit line BLB is instead electrically coupled by another switch, or transistor (not shown), of the selection circuit 211 to a bit line driving circuit (not shown) corresponding to the bit line driving circuit 115. The bit line driving circuit supplies a write voltage, e.g., VDD, to the bit line BLB. In another example, when the transistor MWC is turned ON to electrically couple the bit line BLB to the rail NVSS, the transistor MWT is turned OFF to electrically isolate the bit line BL from the rail NVSS. The bit line BL is instead electrically coupled by another switch, or transistor (not shown), of the selection circuit 211 to the bit line driving circuit which supplies the write voltage, e.g., VDD, to the bit line BL.

The write assist circuit 213 comprises an input 231, an output 232, a first circuit 240, a second circuit 250, a capacitor C, and a switch MPD.

The input 231 is configured to receive an enable signal ENB from the control circuit for enabling the write assist circuit 213 in a write operation of one or more memory cells.

The output 232 is electrically coupled to the rail NVSS. The output 232, through the rail NVSS, is controllably couplable to the bit line BL or bit line BLB by the selection circuit 211 in a write operation, as described herein.

The first circuit 240 and the capacitor C are electrically coupled in series between the input 231 and output 232. The first circuit 240 comprises an input circuit 241 and an output circuit 242. The input circuit 241 is electrically coupled to the input 231 to receive the enable signal ENB. The output circuit 242 is electrically coupled between the input circuit 241 and a first terminal 244 of the capacitor C. A second terminal 245 of the capacitor C is electrically coupled to the output 232.

The second circuit 250 is electrically coupled between the input 231 and a control terminal 252 of the switch MPD. The switch MPD further comprises a first terminal 254 electrically coupled to a node of a reference voltage, e.g., the ground voltage VSS, and a second terminal 255 electrically coupled to the output 232. Other reference voltages are within the scopes of various embodiments. The switch MPD in the example configuration in FIG. 2A is an NMOS transistor, and the control terminal 252, and first and second terminals 254, 255 are correspondingly the gate and source/drains of the NMOS transistor. In at least one embodiment, the switch MPD is a PMOS transistor.

In some embodiments, the capacitor C is a metal-insulator-metal (MIM) capacitor. In an example, a MIM capacitor comprises, as the first terminal 254 and second terminal 255, conductive patterns correspondingly in two different metal layers physically over each other and also over the memory array 201 and one or more components of the memory controller. A dielectric layer between the two different metal layers configures a dielectric for the MIM capacitor. In a further example, a MIM capacitor comprises, as the first terminal 254 and second terminal 255, two conductive patterns in the same metal layer which is physically over the memory array 201 and one or more components of the memory controller. A dielectric material between the two conductive patterns configures a dielectric for the MIM capacitor. In at least one embodiment, the capacitor C is configured by a transistor, e.g., a MOS transistor, and is sometimes referred to as a MOS capacitor. An example of a MOS capacitor is described with respect to FIG. 2D. Other capacitor configurations are within the scopes of various embodiments.

The first circuit 240 is configured to have a first delay greater than a second delay of the second circuit 250. In at least one embodiment, at least one of the input circuit 241 or the output circuit 242 comprises one or more delay circuits configured to generate a first delayed enable signal ENB1 which corresponds to the enable signal ENB and arrives at the first terminal 244 of the capacitor C with the first delay after the arrival of the enable signal ENB at the input 231. In some embodiments, the second circuit 250 comprises one or more delay circuits configured to generate a second delayed enable signal ENB2 which corresponds to the enable signal ENB and arrives at the control terminal 252 of the switch MPD with the second delay shorter than the first delay, after the arrival of the enable signal ENB at the input 231. In at least one embodiment, the second circuit 250 is simply a conductor and includes no other circuits.

Because the second delay is shorter than the first delay, as described herein, the switch MPD disconnects the output 232 and the rail NVSS from VSS, causing the rail NVSS to be floating before the first delayed enable signal arrives at the first terminal 244 of the capacitor C. While the rail NVSS is floating, the arrival of the first delayed enable signal at the first terminal 244 of the capacitor C causes a voltage drop on the rail NVSS. Such a voltage drop is sometimes referred to as a write assist voltage Vwa. Because the rail NVSS is electrically coupled to one of the pair of bit lines BL/BLB by the selection circuit 211, a bit line voltage on the bit line BL or bit line BLB is pulled, by the voltage drop or write assist voltage Vwa, below VSS to a negative voltage level. This negative voltage level of the bit line voltage assists the write operation to be successfully performed. For example, in a write operation, the bit line BL is electrically coupled to the rail NVSS and the bit line voltage on the bit line BL is pulled by the write assist circuit 213 to a negative voltage level, whereas the bit line BLB is electrically coupled to the bit line driving circuit which supplies VDD to the bit line BLB. A voltage difference between VDD on the bit line BLB and the negative voltage level on the bit line BL is sufficient to write a corresponding logic value to the accessed memory cell in the memory array 201. Additional details of a write operation in accordance with some embodiments are described with respect to FIG. 3B.

The input circuit 241 is in a VDD power domain 261, and the output circuit 242 is in the VDDM power domain 262. For example, the input circuit 241 is electrically coupled to receive power supply from a VDD power rail, and the output circuit 242 is electrically coupled to receive power supply from a VDDM power rail, as schematically illustrated in FIG. 2A. The VDDM power domain 262 is also the same power domain to which the memory array 201 belongs, i.e., memory cells in the memory array 201 are electrically coupled to receive power supply from one or more VDDM power rails. The selection circuit 211, the second circuit 250 and the switch MPD are in a power domain 263. In at least one embodiment, the power domain 263 is either the VDD power domain or the VDDM power domain.

In some embodiments, VDD is lower than VDDM. For example, in low switching power applications and/or to reduce power consumption of the memory device 200A, the operating voltage of the memory array 201, i.e., VDDM, is configured to be at or close to Vmin which is a minimum power supply voltage required for reliable read operations and write operations in the memory array 201. At least a part of the memory controller is configured to operate at the lower operating voltage VDD to further reduce power consumption of the memory device 200A. In at least one embodiment, such an ADR configuration is advantageous over other approaches, e.g., an interface dual-rail configuration, at least in terms of power consumption. In the interface dual-rail configuration, a memory array and a memory controller of the memory array are configured to operate at the same operating voltage, e.g., VDDM, and level shifter circuits are configured only at I/O circuits for data exchange with external circuitry at the lower VDD. Because the memory controller in the interface dual-rail configuration operates substantially entirely on the higher operating voltage VDDM, power consumption is higher than the memory device 200A in accordance with one or more embodiments where various circuits or components in the memory controller are configured to operate at the lower operating voltage VDD.

There is a concern of weak write assist ability in a configuration where the whole write assist circuit is configured to operate at the lower operating voltage VDD. In some embodiments, such a concern is obviated and sufficient write assist ability is ensured by configuring the last stage, or the output circuit 242, of the write assist circuit 213 to operate at the higher operating voltage VDDM of the memory array 201. Indeed, because the output circuit 242 is in the VDDM power domain, the first delayed enable signal ENB1 output by the output circuit 242 is a signal in the VDDM power domain. For example, the first delayed enable signal ENB1 switches between VDDM and VSS. Because the first delayed enable signal ENB1 is in the VDDM power domain, the voltage drop or write assist voltage Vwa generated by the first delayed enable signal ENB1 coupled through the capacitor C has a voltage level corresponding to VDDM. As a result, the negative voltage level on the bit line BL or bit line BLB and caused by the write assist voltage Vwa also corresponds to VDDM. In at least one embodiment, a voltage corresponding to VDDM means that the absolute magnitude of such voltage depends on, or is determined by, the absolute magnitude of VDDM. In the example write operation described herein, despite the lower voltage VDD on the bit line BLB, the negative voltage level on the bit line BL caused by the write assist circuit 213 corresponds to the higher operating voltage VDDM, and a voltage difference between the pair of bit lines BL/BLB is sufficient for a successful write operation. As a result, it is possible, in one or more embodiments, to avoid or mitigate a potential issue of weak write assist ability associated with the lower operating voltage VDD. Such reliable write operations at low operating voltages, in accordance with some embodiments, are improvements over other approaches.

In some embodiments, VDD is higher than VDDM. There is a concern of reduced memory cell (or bitcell) reliability in a configuration where the whole write assist circuit is configured to operate at the higher operating voltage VDD, due to an excessive negative voltage level on the bit line BL or bit line BLB. In some embodiments, such a concern is obviated and sufficient bitcell reliability is ensured by configuring the last stage, or the output circuit 242, of the write assist circuit 213 to operate at the lower operating voltage VDDM of the memory array 201. As described herein, the negative voltage level on the bit line BL (or BLB) caused by the write assist circuit 213 corresponds to VDDM. When VDDM is lower than VDD, an excessive negative voltage level on the bit line BL (or BLB) is avoidable. As a result, it is possible, in one or more embodiments, to avoid or mitigate a potential issue of reduced bitcell reliability associated with the higher operating voltage VDD.

In some embodiments, by configuring the last stage, or the output circuit 242, of the write assist circuit 213 to operate at the same operating voltage VDDM of the memory array 201, it is possible to provide advantageous power tracking between the negative voltage level on the bit line BL (or BLB) and VDDM. Specifically, as described herein, the negative voltage level on the bit line BL (or BLB) corresponds to VDDM. Therefore, when VDDM is increased or decreased, due to fluctuations or transient evens in the power supply or power source, the absolute value or magnitude of the negative voltage level on the bit line BL (or BLB) is correspondingly increased or decreased and follows the fluctuations of VDDM. As a result, write operations in the memory device 200A in accordance with some embodiments are stable, reliable and unlikely affected by VDDM power supply fluctuations.

In some embodiments, write operations in the memory device 200A are not affected by the write assist circuit 213, whereas write assist ability is improved.

Figure 2B:
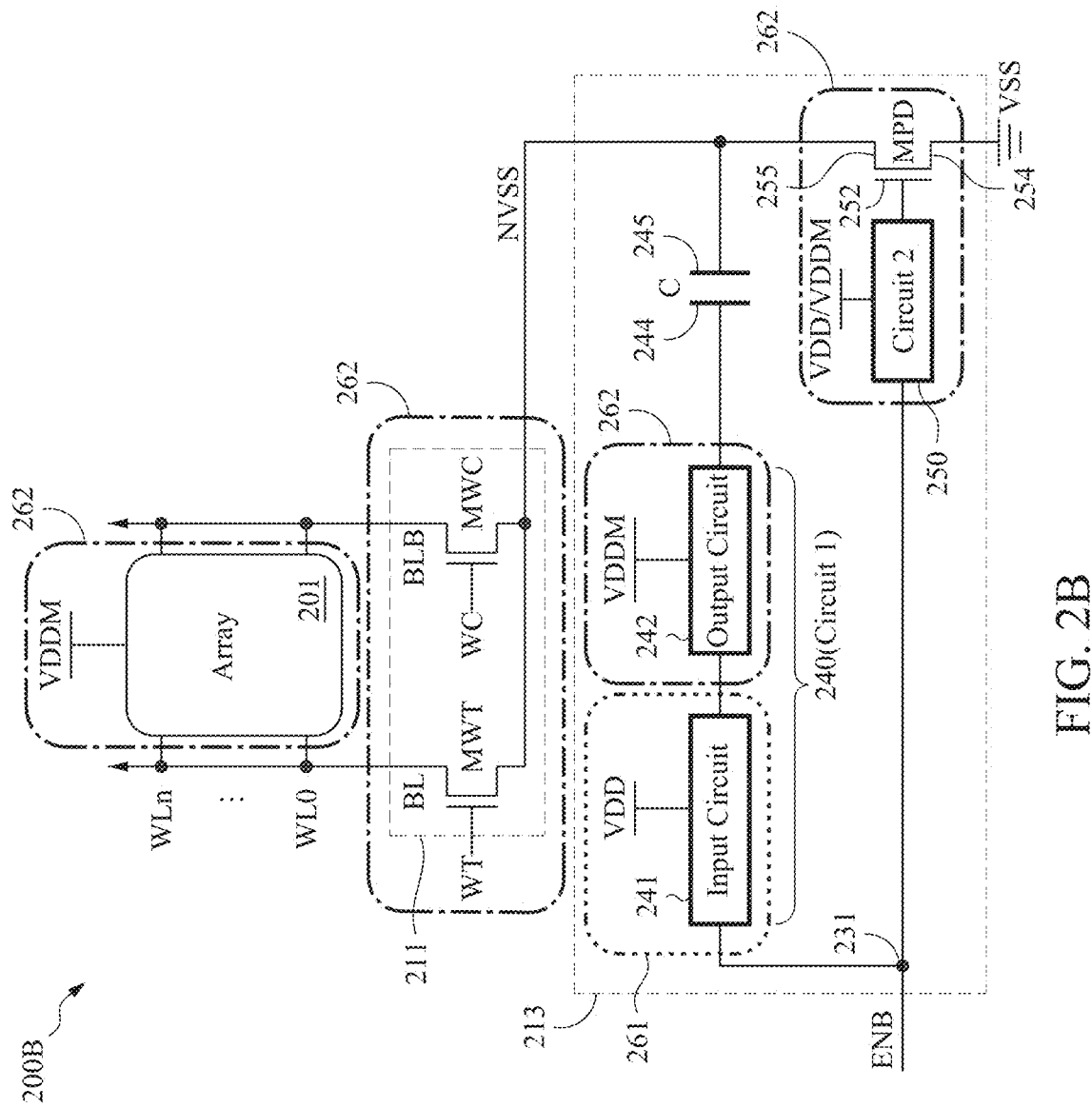
Figure 2C:
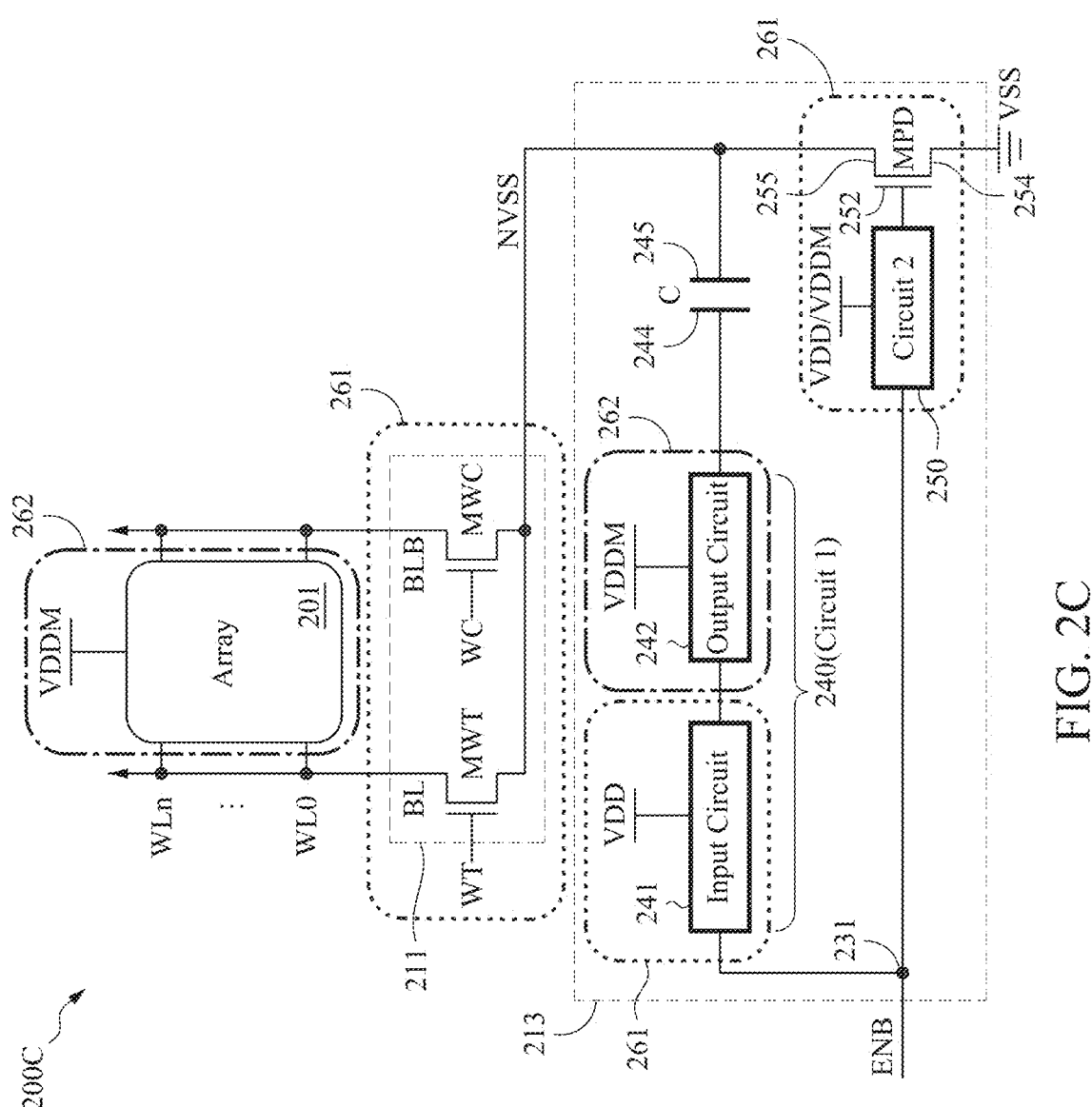

FIGS. 2B-2C are schematic circuit diagrams of corresponding memory devices 200B-200C, in accordance with some embodiments. For simplicity, corresponding components in FIGS. 2A-2C are designated by the same reference numerals.

In FIG. 2B, the memory device 200B is an example configuration in which the selection circuit 211, the second circuit 250 and the switch MPD are all in the VDDM power domain 262. In some embodiments, the memory device 200B is configured to operate in a manner similar to that described with respect to the memory device 200A.

In FIG. 2C, the memory device 200C is an example configuration in which the selection circuit 211, the second circuit 250 and the switch MPD are all in the VDD power domain 261. In some embodiments, the memory device 200C is configured to operate in a manner similar to that described with respect to the memory device 200A.

As described herein, whether the selection circuit 211, the second circuit 250 and the switch MPD are in the VDD power domain 261 (Configuration 1) or VDDM power domain 262 (Configuration 2) are design considerations which depend on various factors including, but not limited to, one or more power-performance-area (PPA) requirements, dual rail voltage supporting range, or the like. For example, in some embodiments, memory devices of Configuration 1 have lower power consumption and leakage than memory devices of Configuration 2, because VDD<VDDM in most use cases. In some embodiments, memory devices of Configuration 2 have better performance and dual rail voltage supporting ranges than memory devices of Configuration 1. In one or more embodiments, a better dual rail voltage supporting range means it is possible to achieve a greater value of $\Delta V=|VDDM-VDD|$. Thus, when power consumption and/or leakage is/are preferred over performance and/or dual rail voltage supporting range, the selection circuit 211, the second circuit 250 and the switch MPD are configured in the VDD power domain 261 (Configuration 1) in accordance with some embodiments. When performance and/or dual rail voltage supporting range is/are preferred over power consumption and/or leakage, the selection circuit 211, the second circuit 250 and the switch MPD are configured in the VDDM power domain 262 (Configuration 2). In at least one embodiment, one or more advantages described herein are achievable by one or more of the memory devices 200B-200C.

Figure 2E:
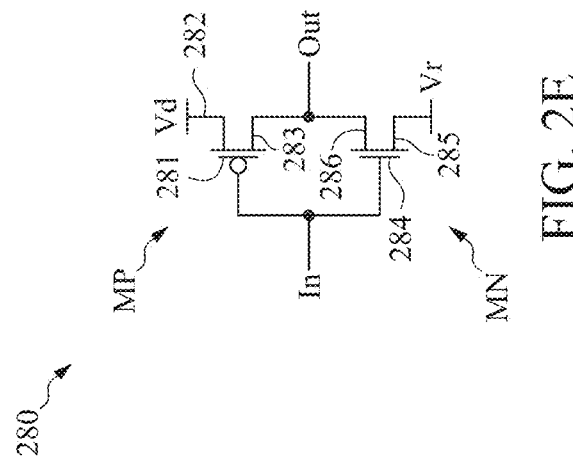
FIGS. 2D-2E are schematic circuit diagrams of various circuits in memory devices, in accordance with some embodiments.
Figure 2D:
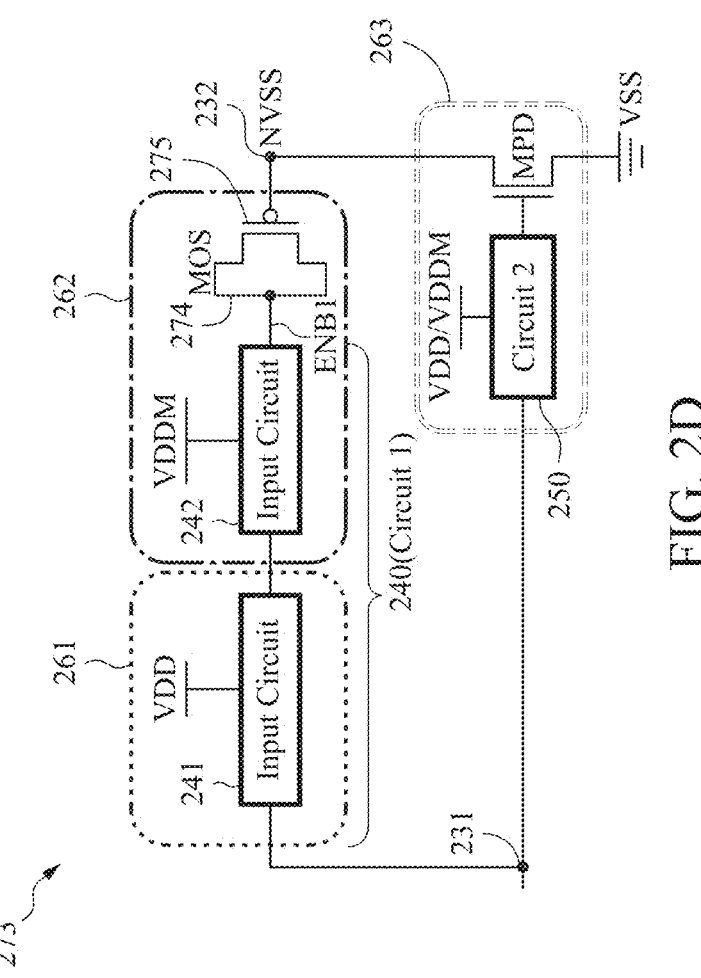

FIG. 2D is a schematic circuit diagram of a part of a write assist circuit 273 for a memory device, in accordance with some embodiments. In some embodiments, the write assist circuit 273 corresponds to the write assist circuit 213 and/or the memory device containing the write assist circuit 273 corresponds to one or more of the memory devices 200A-200C. For simplicity, corresponding components in FIGS. 2A-2D are designated by the same reference numerals.

The write assist circuit 273 is an example configuration of the write assist circuit 213 where the capacitor C comprises a MOS capacitor. The MOS capacitor is a MOS transistor, e.g., a PMOS transistor. Source/drains 274 of the PMOS transistor are electrically coupled together, and configure a first terminal of the MOS capacitor which corresponds to the first terminal 254 of the capacitor C. A gate 275 of the PMOS transistor configures a second terminal of the MOS capacitor which corresponds to the second terminal 255 of the capacitor C. In some embodiments, the MOS capacitor comprises an NMOS transistor.

The MOS capacitor is in the VDDM power domain 262 which is the same power domain to which the output circuit 242 and the memory array 201 (not shown in FIG. 2D) belong. In some embodiments, a reason for this configuration is to enable the MOS capacitor to properly couple the first delayed enable signal ENB1, which is a signal in the VDDM power domain, to the rail NVSS. In at least one embodiment, a further reason for this configuration is to enable the MOS capacitor to be physically formed close to, and/or together with, the output circuit 242 which is in the VDDM power domain. The write assist circuit 273 is configured to operate in a manner similar to that described with respect to the write assist circuit 213. In at least one embodiment, one or more advantages described herein are achievable by the write assist circuit 273 and/or a memory device including the write assist circuit 273.

FIG. 2E is a schematic circuit diagram of an inverter 280 as an example circuit in a power domain of a memory device, in accordance with some embodiments. In some embodiments, the power domain in which the inverter 280 is configured corresponds to the VDD power domain 261 or the VDDM power domain 262. In some embodiments, memory device including the inverter 280 corresponds to one or more memory devices described herein with respect to FIGS. 1, 2A-2D, 3A, 4A-4D. In some embodiments, the inverter 280 is configured as, or is a component of, one or more circuits in the memory device. Examples of such circuits include, but are not limited to, delay circuits, driving circuits, level shifter circuits, or the like, as described herein. Other circuit configurations are within the scopes of various embodiments.

The inverter 280 comprises a PMOS transistor MP, and an NMOS transistor MN. The transistor MP comprises a gate 281, and source/drains 282, 283. The gate 281 is electrically coupled to an input In of the inverter 280. The source/drain 282 is electrically coupled to a node of a positive power supply voltage Vd of a power domain which, for simplicity, is referred to by the same reference numeral Vd. The source/drain 283 is electrically coupled to an output Out of the inverter 280. The transistor MN comprises a gate 284, and source/drains 285, 286. The gate 284 is electrically coupled to the gate 281 and the input In. The source/drain 285 is electrically coupled to a node of a reference voltage Vr lower than Vd. In some embodiments, Vr is the ground voltage VSS. Other reference voltages are within the scopes of various embodiments. The source/drain 286 of the transistor MN is electrically coupled to the source/drain 283 of the transistor MP and the output Out.

The inverter 280 is powered by the positive power supply voltage, i.e., Vd, of the power domain Vd. Although the transistor MN is not directly electrically coupled to Vd, it is still powered by Vd, e.g., when the transistor MP is turned ON. In some embodiments, Vd is VDD and the power domain Vd corresponds to the VDD power domain 261. In at least one embodiment, Vd is VDDM and the power domain Vd corresponds to the VDDM power domain 262.

The inverter 280 is configured to receive an input signal at the input In, generate an inverted signal of the input signal, and output the inverted signal as an output signal at the output Out. The output signal is in the power domain Vd, and switches between a high level corresponding to Vd and a low level corresponding to Vr. When Vd is VDD, the inverter 280 is in the VDD power domain and outputs output signals in the VDD power domain. When Vd is VDDM, the inverter 280 is in the VDDM power domain and outputs output signals in the VDDM power domain.

In some embodiments, the inverter 280 is configured as a delay circuit, or a part of a delay circuit, and outputs the output signal at a predetermined or designed delay after the arrival of the input signal. Example delay circuits in accordance with some embodiments are described herein with respect to FIGS. 2A-2D, 3A, 4A-4D.

In some embodiments, the inverter 280 is configured as a driving circuit, for example, a bit line driving circuit or a word line driving circuit, as described herein with respect to FIG. 1.

In some embodiments, the inverter 280 is configured as a level shifter circuit. For example, when the input signal is in a power domain different from the power domain Vd, the inverter 280 is configured to shift the signal level from the power domain of the input signal to the power domain Vd of the output signal. Specifically, when the input signal is in the VDD power domain and Vd is VDDM, a high level (e.g., VDD) of the input signal turns OFF the transistor MP and turns ON the transistor MN, resulting in a low level of the output signal, whereas a low level of the input signal turns OFF the transistor MN and turns ON the transistor MP, resulting in a high level (e.g., Vd=VDDM) of the output signal. As a result, the input signal having the high level of VDD is output by the inverter 280 as the output signal having the high level of VDDM. In other words, the inverter 280 is configured to shift the signal level from VDD at the input In to VDDM at the output Out. Similarly, when the input signal is in the VDDM power domain and Vd is VDD, the inverter 280 is configured to shift the signal level from VDDM at the input In to VDD at the output Out. In some embodiments, the inverter 280 is configured as more than one of a delay circuit, a driving circuit, and a level shifter circuit.

Figure 3B:
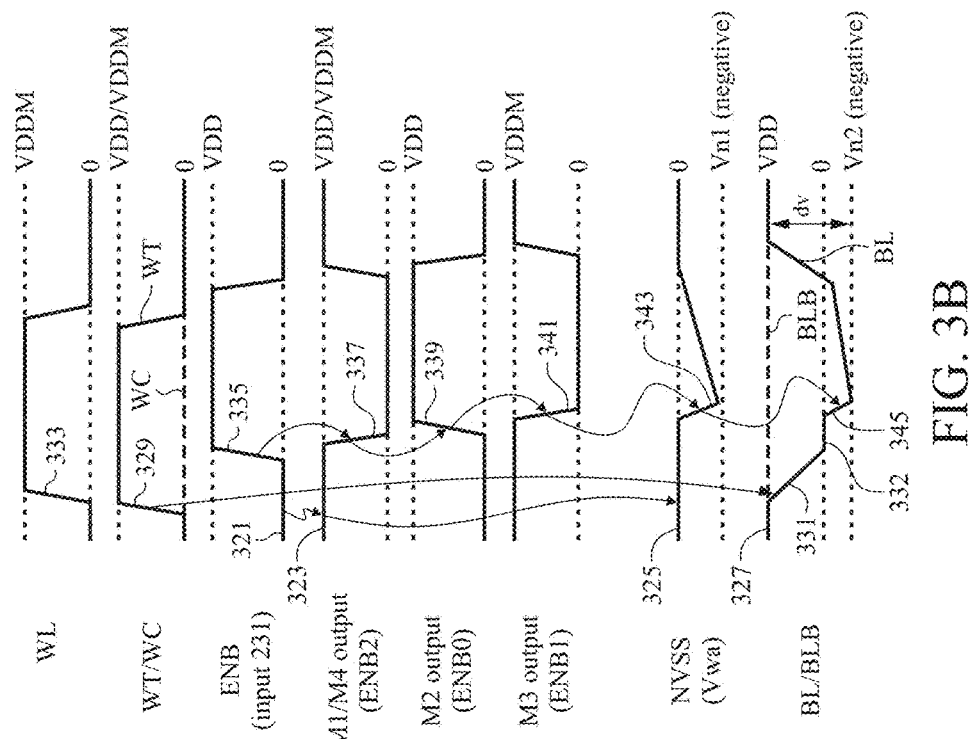
FIG. 3B is a schematic timing diagram of a write operation of the memory device, in accordance with some embodiments.
Figure 3A:
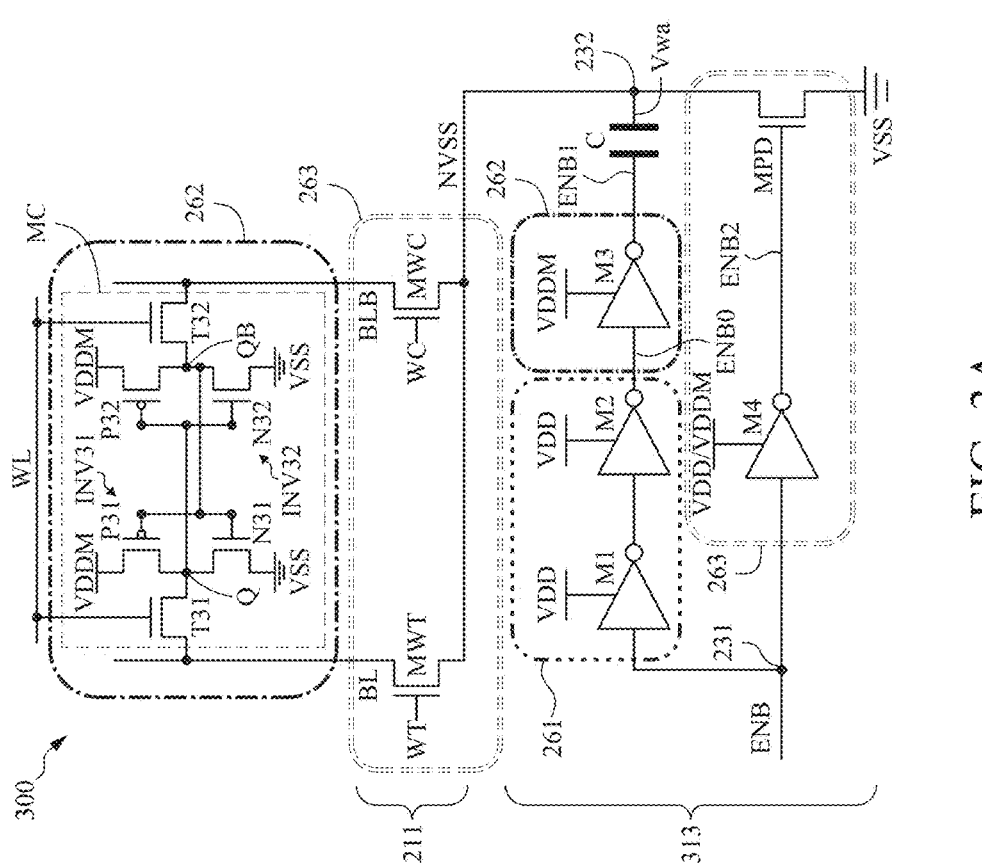
FIG. 3A is a schematic circuit diagram of a memory device.

FIG. 3A is a schematic circuit diagram of a memory device 300, in accordance with some embodiments. In some embodiments, the memory device 300 corresponds to one or more of the memory devices 100 and 200A-200C. For simplicity, corresponding components in FIGS. 2A-2C and 3A are designated by the same reference numerals.

A memory cell MC with a corresponding word line WL and a corresponding pair of bit lines BL/BLB of the memory device 300 is illustrated in FIG. 3A, whereas other memory cells, word lines and bit lines are omitted for simplicity. In the example configuration in FIG. 3A, the memory cell MC is a 6-transistor (6T) static random-access memory (SRAM) memory cell. Other memory types and/or SRAM configurations, such as 4T SRAM, 8T SRAM, 10T SRAM, 12 SRAM, or the like, are within the scopes of various embodiments.

The memory cell MC comprises a first inverter INV31 comprising a pair of a P-type transistor P31 and an N-type transistor N31, a second inverter INV32 comprising a pair of a P-type transistor P32 and an N-type transistor N32, and access transistors or pass gates T31, T32. In the example configuration in FIG. 3A, transistors T31, T32 are N-type transistors. In an example, in the memory cell MC, the N-type transistors are NMOS transistors and the P-type transistors are PMOS transistors.

The inverters INV31, INV32 are cross-coupled to each other to form a latching circuit for data storage. For example, a cross-coupling connection electrically couples an output (node Q) of the first inverter INV31 to an input of the second inverter INV32, and a further cross-coupling connection electrically couples an input of the first inverter INV31 to an output (node QB) of the second inverter INV32. The input of the first inverter INV31 is configured by gates of transistor P31 and transistor N31, and the output Q of the first inverter INV31 is configured by electrically coupled first source/drains of transistor P31 and transistor N31. The input of the second inverter INV32 is configured by gates of transistor P32 and transistor N32, and the output QB of the second inverter INV32 is configured by electrically coupled first source/drains of transistor P32 and transistor N32. Second terminals of transistor P31 and transistor P32 are electrically coupled to a power supply of VDDM, while second terminals of transistor N31 and transistor N32 are electrically coupled to a reference voltage, for example, the ground voltage VSS. As result, the memory cell MC is power by VDDM and is in the VDDM power domain.

A bit of data is stored in the memory cell MC as a voltage level at the node Q, which is accessible by a memory controller via a bit line BL. Access to the node Q is controlled by transistor T31 which is electrically coupled between the bit line BL and the node Q. The node QB stores a bit of data which is the complement to the bit of data stored at the node Q, e.g., when the node Q is at a logic "high," the node QB is at a logic "low," and vice versa. The node QB is accessible by the memory controller via a bit line BLB. Access to the node QB is controlled by transistor T32 which is electrically coupled between a bit line BLB and the node QB. Gates of transistor T31 and transistor T32 are electrically coupled to a word line WL via which the memory controller, or a word line driving circuit thereof, supplies an access voltage to turn ON transistors T31, T32 to allow access to the memory cell MC in a read operation or a write operation.

The memory device 300 comprises a write assist circuit 313 corresponding to the write assist circuit 213. The write assist circuit 313 comprises inverters M1, M2, M3 electrically coupled in series between the input 231 and the capacitor C, and configuring a first circuit corresponding to the first circuit 240. The inverters M1, M2 configure an input circuit in the VDD power domain 261 and corresponding to the input circuit 241. The inverter M3 configures an output circuit in the VDDM power domain 262 and corresponding to the output circuit 242. The write assist circuit 313 further comprises an inverter M4 configures a second circuit in the power domain 263 and corresponding to the second circuit 250. In some embodiments, at least one or each of the inverters M1-M4 corresponds to the inverter 280. The inverter M3 is further configured as a level shifter circuit.

The inverters M1, M2 are configured to delay the enable signal ENB to generate a delayed enable signal ENB0. The inverter M3 is configured to further delay the delayed enable signal ENB0 to generate the first delayed enable signal ENB1. The inverter M4 is configured to delay the enable signal ENB to generate the second delayed enable signal ENB2. A total delay caused by the inverters M1-M3 corresponds to the first delay and is greater than the second delay of the inverter M4. A write operation of the memory device 300 in accordance with some embodiments is described with respect to FIG. 3B.

FIG. 3B is a schematic time diagram of a write operation of the memory device 300, in accordance with some embodiments. For simplicity, a voltage of a node, line or rail is referred to by the same reference numeral of the node, line or rail. For example, the voltage on the word line WL is referred to as voltage WL.

Referring to FIGS. 3A-3B, before arrival of the enable signal ENB, a voltage of the input 231 is at a low voltage level 321, e.g., is at the ground voltage VSS or zero. The low voltage level 321 of the voltage at the input 231 corresponds to a high voltage level 323 at the output of inverter M4 which turns ON the switch MPD. As a result, the rail NVSS is electrically coupled by the turned ON switch MPD to VSS, and has a voltage level 325 of VSS. The high voltage level 323 at the output of the inverter M4 is VDD or VDDM depending on whether the power domain 263 is the VDD power domain or VDDM power domain. The voltage at the output of inverter M1 and the voltage at the output of inverter M4 are similar. The high voltage level at the output of inverter M1 is VDD, corresponding to the inverter M1 being configured in the VDD power domain 261. For simplicity, the description herein with respect to the voltage at the output of inverter M4 is also applicable to the voltage at the output of inverter M1.

The pair of bit lines BL/BLB is pre-charged, e.g., by a pre-charge circuit (not shown), to VDD. Corresponding voltages BL, BLB have a high voltage level 327 of VDD as illustrated in FIG. 3B.

The memory controller supplies control signals WT, WC correspondingly to the transistors MWT, MWC of the selection circuit 211. In the example configuration in FIG. 3B, the control signal WT has a high voltage level and the control signal WC has a low voltage level. The high voltage level of the control signal WT is VDD or VDDM depending on whether the power domain 263 is the VDD power domain or VDDM power domain. The transistor MWC remains OFF and electrically isolates the bit line BLB from the rail NVSS.

The transistor MWT is turned ON in response to a leading edge 329, which is a rising edge, of the control signal WT. The turned ON transistor MWT electrically couples the bit line BL to the rail NVSS. VSS on the rail NVSS pulls down the voltage BL (i.e., the bit line voltage) on the bit line BL from the pre-charged VDD toward the ground voltage, as indicated at a section 331 of the voltage BL in FIG. 3B. The voltage BL reaches the ground voltage or VSS, as indicated at a section 332 of the voltage BL in FIG. 3B. In some embodiments, the section 332 is omitted, e.g., the voltage BL has not reached VSS when a next transition described with respect to a section 345 of the voltage BL occurs.

The memory controller supplies an access voltage to the word line WL. The access voltage, or voltage WL, has a high voltage level of VDDM corresponding to the memory array and word line driving circuit of the memory device 300 being configured in the VDDM power domain. Transistors T31, T32 are turned ON in response to a leading edge 333, which is a rising edge, of the voltage WL, and allow access to the latching circuit of the memory cell MC for the write operation.

A leading edge 335 of the enable signal ENB arrives at the input 231, and causes a corresponding leading edge 337 of the second delayed enable signal ENB2. The leading edge 337 of the second delayed enable signal ENB2 is delayed from the leading edge 335 of the enable signal ENB by the second delay of the inverter M4. The leading edge 335 of the enable signal ENB also causes a corresponding leading edge, similar to the leading edge 337, of the voltage at the output of the inverter M1.

The switch MPD is turned OFF in response to the leading edge 337, which is a falling edge, of the second delayed enable signal ENB2. The turned OFF switch MPD electrically isolates the rail NVSS and bit line BL from VSS. As a result, the rail NVSS and bit line BL are floating in response to the leading edge 337 of the second delayed enable signal ENB2.

The leading edge, similar to the leading edge 337, of the voltage at the output of the inverter M1 causes a corresponding leading edge 339, which is a rising edge, of the delayed enable signal ENB0 at the output of inverter M2.

The leading edge 339 of the delayed enable signal ENB0 causes a corresponding leading edge 341, which is a falling edge, of the first delayed enable signal ENB1 at the output of the inverter M3. The leading edge 341 of the first delayed enable signal ENB1 is delayed from the leading edge 335 of the enable signal ENB by the first delay of the inverters M1-M3. A high voltage level of the first delayed enable signal ENB1 is VDDM, corresponding to the inverter M3 being configured in the VDDM power domain 262.

The leading edge 341 of the first delayed enable signal ENB1 is a transient voltage which is coupled by the capacitor C to the floating rail NVSS and bit line BL. Because the leading edge 341 is a falling edge, the voltage on the rail NVSS is pulled down, as indicated by a voltage drop 343 or write assist voltage Vwa in FIG. 3B, from VSS to a negative voltage level Vn1. Because the first delayed enable signal ENB1 is decreased from VDDM to VSS in the falling edge 341, an absolute value or magnitude of the voltage drop 343 corresponds to VDDM (rather than to VDD).

The voltage drop 343 on the rail NVSS causes a corresponding voltage drop 345 on the bit line BL which is still floating and electrically coupled to the rail NVSS. As a result, the voltage BL is pulled down to a negative voltage level Vn2.

In some embodiments, an absolute value or magnitude of the voltage drop 345 is the same as that of the voltage drop 343. In at least one embodiment, an absolute value or magnitude of the voltage drop 345 is different from, e.g., smaller than, the absolute value or magnitude of the voltage drop 343. In any event, because the voltage drop 343 on the rail NVSS corresponds to VDDM, the voltage drop 345 on the bit line BL also corresponds to VDDM (rather than to VDD).

In some embodiments, an absolute value of the negative voltage level Vn2 is the same as that of the negative voltage level Vn1. In at least one embodiment, the absolute value of the negative voltage level Vn2 is different from, e.g., smaller than, the absolute value of the negative voltage level Vn1. In any event, an absolute value of a voltage difference dV between the voltage BLB and the voltage BL becomes greater than VDD, as illustrated in FIG. 3D. The voltage difference dV is sufficient to write a corresponding logic value, e.g., logic "0," in the latching circuit of the memory cell MC.

In a write operation to write logic "1" in the memory cell MC, transistor MWT is turned OFF, transistor MWC is turned ON, voltage BL is at VDD, and voltage BLB is pulled down to a negative voltage level in a manner similar to that described with respect to voltage BL in FIG. 3B.

In at least one embodiment, one or more advantages described herein are achievable by the memory device 300. For example, compared to approaches where a write assist circuit is not included in a memory device, a maximal absolute value of a voltage difference between pair of bit lines in a write operation is VDD. In low power applications where VDD is a low voltage, such a voltage difference of VDD is potentially not sufficient for a reliable and/or successful write operation. In contrast, in one or more embodiments, the maximal absolute value of the voltage difference dV between the pair of bit lines BL/BLB is greater than VDD, thereby ensuring for a reliable and/or successful write operation.

In situations where VDD is lower than VDDM, a concern of weak write assist ability exists even when a write assist circuit is included, but is configured to operate entirely at VDD. In contrast, in one or more embodiments, because the voltage drop 343 and voltage drop 345 correspond to, or track, VDDM higher than VDD, the voltage difference dV becomes larger, and it is possible to avoid or mitigate a potential issue of weak write assist ability associated with the operating voltage VDD lower than VDDM.

In situations where VDD is higher than VDDM, there is a concern of an excessive voltage difference between the pair of bit lines when a write assist circuit is included, but is configured to operate entirely at VDD. An excessive voltage difference between the pair of bit lines potentially raises an issue of bitcell reliability. In contrast, in one or more embodiments, because the voltage drop 343 and voltage drop 345 correspond to, or track, VDDM lower than VDD, the voltage difference dV becomes smaller, and it is possible to avoid or mitigate a potential issue of bitcell reliability associated with the operating voltage VDD higher than VDDM.

In some embodiments, the voltage drop 343 and voltage drop 345 correspond to, or track, VDDM, as described herein. As a result, it is possible in one or more embodiments to provide advantageous power tracking between the negative voltage level on the bit line BL (or BLB) and VDDM, and write operations in the memory device 300 become stable, reliable and unlikely affected by VDDM power supply fluctuations.

FIGS. 4A-4D are schematic circuit diagrams of corresponding memory devices 400A-400D, in accordance with some embodiments. In some embodiments, at least one or each of the memory devices 400A-400D corresponds to one or more of the memory devices 100, 200A-200C, 300. For simplicity, corresponding components in FIGS. 2A-2C, 3A, 4A-4D are designated by the same reference numerals.

Figure 4A:
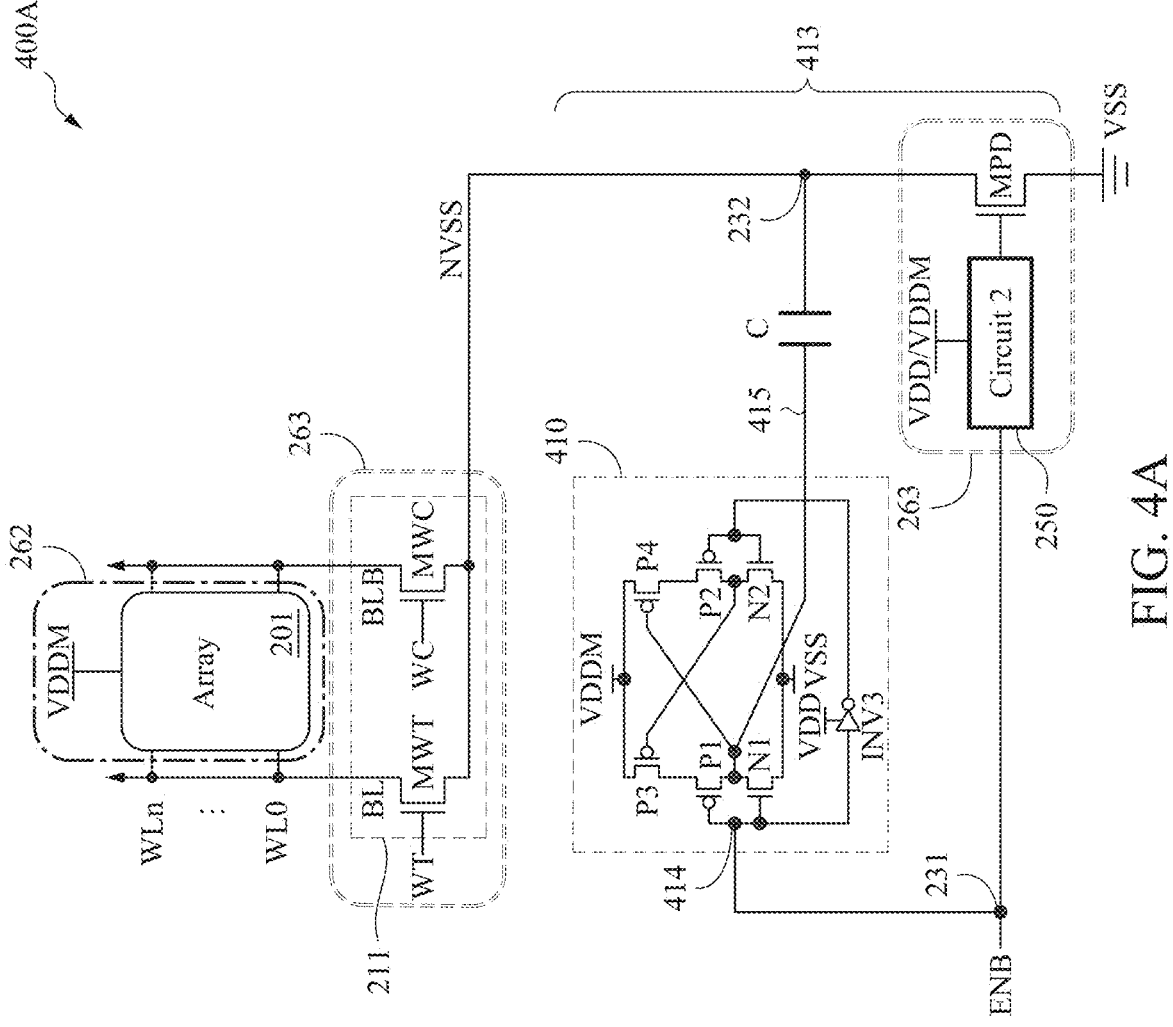
FIGS. 4A-4D are schematic circuit diagrams of various memory devices, in accordance with some embodiments.

In FIG. 4A, a write assist circuit 413 of the memory device 400A comprises a level shifter circuit 410 instead of the inverters M1-M3 of the memory device 300.

The level shifter circuit 410 comprises a first inverter configured by PMOS transistor P1 and NMOS transistor N1, a second inverter configured by PMOS transistor P2 and NMOS transistor N2, a third inverter INV3, and a pair of PMOS transistors P3, P4. An input of the first inverter is also an input 414 of the level shifter circuit 410 and is configured by gates of transistors P1, N1 which are electrically coupled together and to the input 231 of the write assist circuit 413 as well as to an input of inverter INV3. An output of the first inverter is configured by first source/drains of transistors P1, N1 which are electrically coupled together and to a gate of transistor P4, and to an output 415 of the level shifter circuit 410. A second source/drain of transistor P1 is electrically coupled to a first source/drain of transistor P3. A second source/drain of transistor N1 is electrically coupled to VSS. An input of the second inverter is configured by gates of transistors P2, N2 which are electrically coupled together and to an output of inverter INV3. An output of the second inverter is configured by first source/drains of transistors P2, N2 which are electrically coupled together and to a gate of transistor P3. A second source/drain of transistor P2 is electrically coupled to a first source/drain of transistor P4. A second source/drain of transistor N2 is electrically coupled to VSS. Second source/drains of transistors P3, P4 are electrically coupled to VDDM. The inverter INV3 is electrically coupled to and powered by VDD. In some embodiments, the inverter INV3 corresponds to the inverter 280. Transistors N1, N2 and inverter INV3 are in the VDD power domain and, in some embodiments, correspond to input circuit 241. Transistors P1-P4 are in the VDDM power domain and, in some embodiments, correspond to output circuit 242.

In operation, when the enable signal ENB at the input 231 or input 414 is at a high voltage level, transistor P1 is turned OFF, transistor N1 is turned ON, and the output of inverter INV3 is at a low voltage level. The output 415 is electrically coupled by the turned ON transistor N1 to VSS. VSS at the output 415 turns ON transistor P4. The low voltage level at the output of inverter INV3 turns ON transistor P3 and turns OFF transistor N2. VDDM is applied through turned ON transistors P2, P4 to the gate of transistor P3 and turns OFF transistor P3. When the enable signal ENB at the input 231 or input 414 is at a low voltage level, transistor P1 is turned ON, transistor N1 is turned OFF, and the output of inverter INV3 is at a high voltage level. The high voltage level at the output of inverter INV3 turns OFF transistor P3 and turns ON transistor N2. The gate of P3 is electrically coupled by the turned ON transistor N2 to VSS, and transistor P3 is turned ON. VDDM is applied through turned ON transistors P1, P3 to the output 415, and also to the gate of transistor P4 and turns OFF transistor P4.

Thus, the level shifter circuit 410 is configured to shift the signal level from the VDD power domain at the input 414 to the VDDM power domain at the output 415, and to invert the enable signal ENB at the input 414 to generate an inverted signal of enable signal ENB at the output 415. The level shifter circuit 410 is further configured to delay the inverted signal at the output 415 to be behind the enable signal ENB at the input 414 by a first delay greater than the second delay of the second circuit 250. The described level shifter circuit is an example. Other level shifter circuit configurations are within the scopes of various embodiments.

Figure 4B:
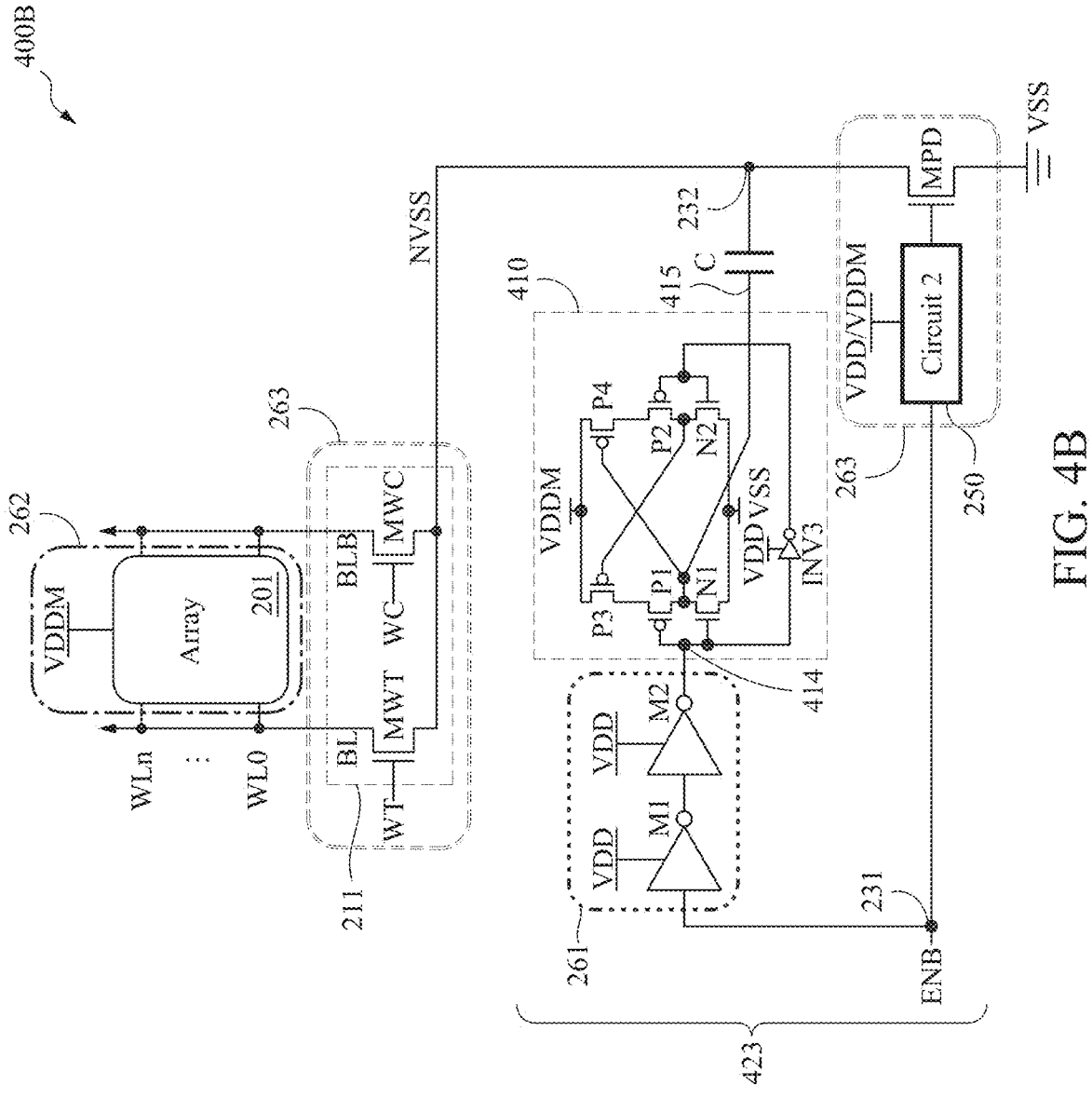

In FIG. 4B, a write assist circuit 423 of the memory device 400B comprises the level shifter circuit 410 instead of the inverter M3 of the memory device 300. A total delay of inverters M1, M2 and level shifter circuit 410 corresponds to the first delay of the first circuit 240 and is greater than the second delay of the second circuit 250. The level shifter circuit 410 is configured to perform level shifting from the VDD power domain to the VDDM power domain, and is also configured as the output circuit 242.

Figure 4C:
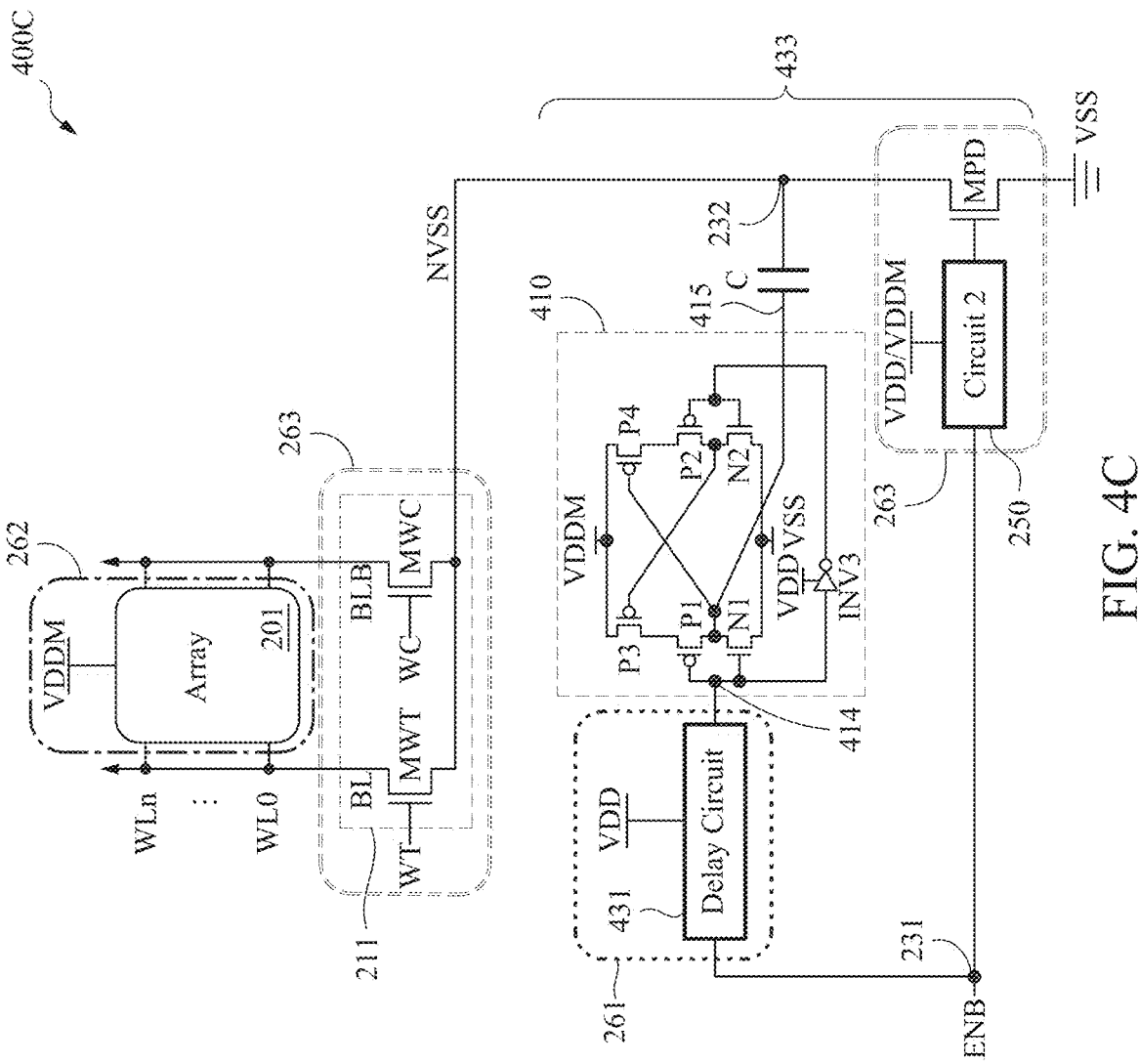

In FIG. 4C, a write assist circuit 433 of the memory device 400C comprises a delay circuit 431 instead of the inverters M1, M2 of the memory device 400B. A total delay of the delay circuit 431 and level shifter circuit 410 corresponds to the first delay of the first circuit 240 and is greater than the second delay of the second circuit 250. In some embodiments, the delay circuit 431 comprises one or more serially coupled inverters each corresponding to the inverter 280. Other delay circuit configurations are within the scopes of various embodiments. The delay circuit 431 is in the VDD power domain 261. The level shifter circuit 410 is configured to perform level shifting from the VDD power domain to the VDDM power domain, and is also configured as the output circuit 242.

Figure 4D:
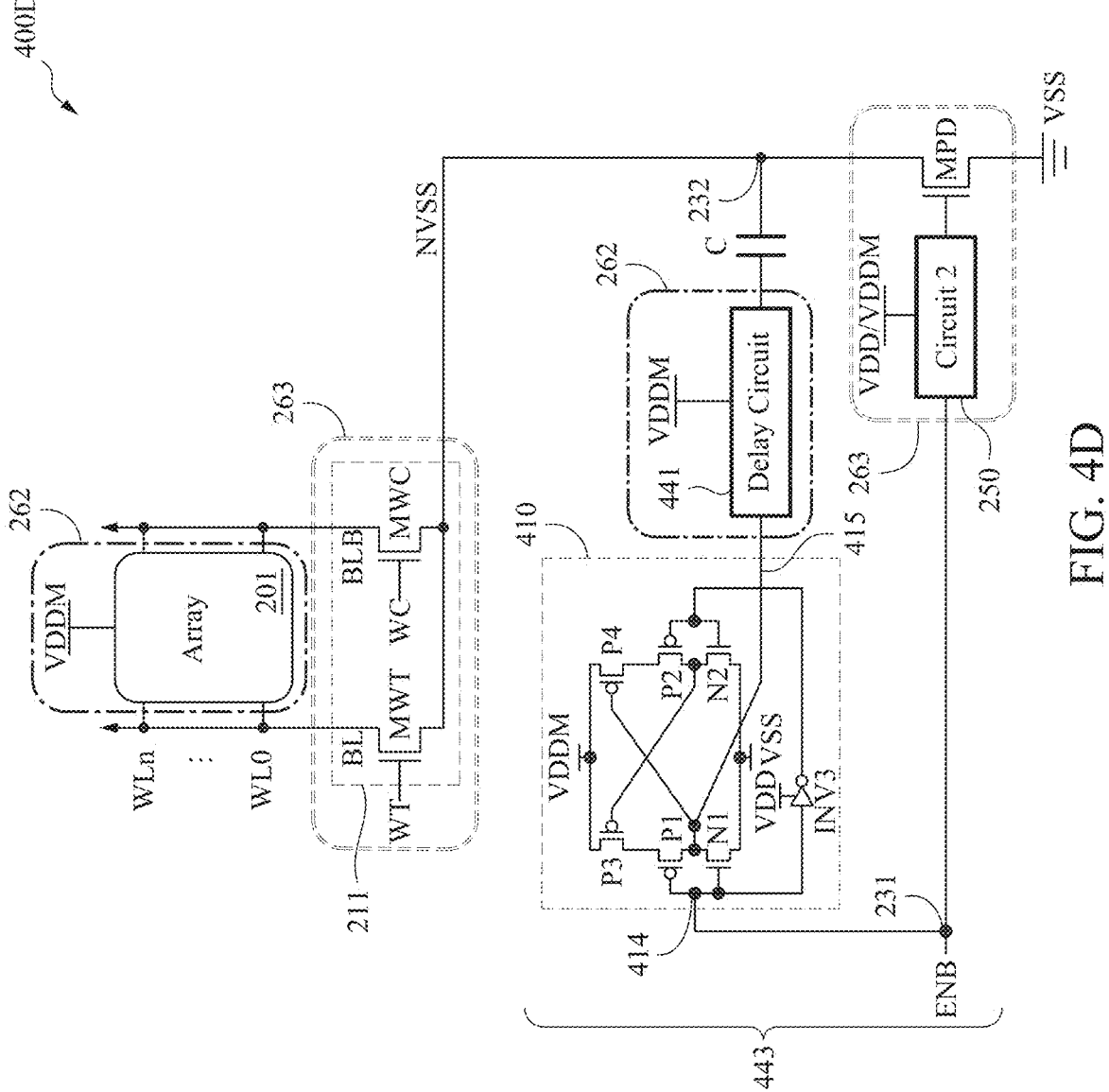

In FIG. 4D, a write assist circuit 443 of the memory device 400D, compared to the write assist circuit 413 in FIG. 4A, additionally comprises a delay circuit 441 between the level shifter circuit 410 and the capacitor C. A total delay of the delay circuit 441 and level shifter circuit 410 corresponds to the first delay of the first circuit 240 and is greater than the second delay of the second circuit 250. In some embodiments, the delay circuit 441 comprises one or more serially coupled inverters each corresponding to the inverter 280. Other delay circuit configurations are within the scopes of various embodiments. The delay circuit 441 is in the VDDM power domain 262. The level shifter circuit 410 is configured to perform level shifting from the VDD power domain to the VDDM power domain, and is also configured as the input circuit 241. The delay circuit 441 is configured as the output circuit 242.

Write operations in each of the memory devices 400A-400D are similar to those described with respect to one or more of FIGS. 2A, 3A, 3B. In at least one embodiment, one or more advantages described herein are achievable by one or more of the memory devices 400A-400D.

Figure 5:
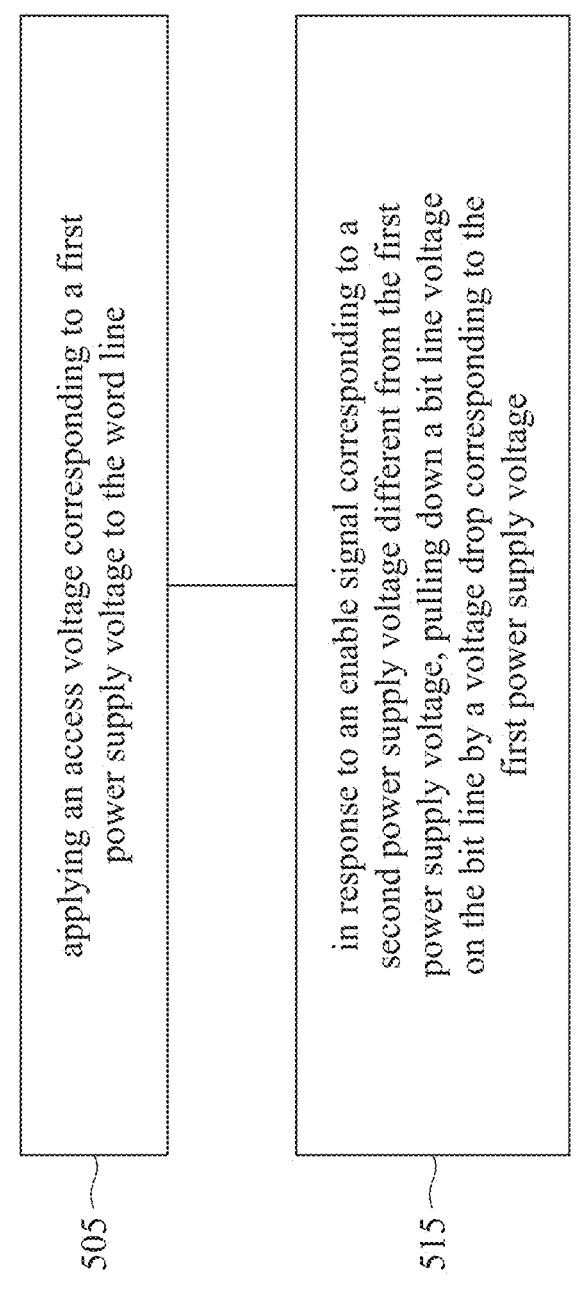
FIG. 5 is a flowchart of a method, in accordance with some embodiments.

FIG. 5 is a flow chart of a method 500 of operating a memory device, in accordance with some embodiments. In some embodiments, the method 500 is performed in a write operation of a memory cell in the memory device, as described with respect to one or more of FIGS. 1-4D.

At operation 505, an access voltage corresponding to a first power supply voltage is applied to a word line electrically coupled to the memory cell selected for the write operation. For example, as described with respect to FIGS. 3A-3B, an access voltage or voltage WL is supplied by a memory controller to the word line WL electrically coupled to the selected memory cell MC. The voltage WL has a high voltage level of VDDM and corresponds to the operating voltage VDDM of the memory cell MC and a memory array containing the memory cell MC. In response to the voltage WL, the memory cell MC becomes accessible for the write operation to be performed therein.

At operation 515, in response to an enable signal corresponding to a second power supply voltage different from the first power supply voltage, a bit line voltage on a bit line electrically coupled to the memory cell MC is pulled down by a voltage drop corresponding to the first power supply voltage. For example, as described with respect to FIGS. 3A-3B, in response to an enable signal ENB, a bit line voltage, i.e., voltage BL, on a bit line BL electrically coupled to the memory cell MC is pulled down by a voltage drop 345 corresponding to the first power supply voltage VDDM. The enable signal ENB is in the VDD power domain and corresponds to a second power supply voltage VDD different from the first power supply voltage VDDM.

In at least one embodiment, the method comprises pulling down the voltage BL to a negative voltage level Vn2 below the ground voltage VSS, as described with respect to FIG. 3B.

In at least one embodiment, the method comprises, in response to the enable signal ENB, generating a first delayed enable signal ENB1 corresponding to the first power supply voltage VDDM, and further generating the voltage drop 345 by coupling an edge 341 of the first delayed enable signal ENB1 through a capacitor C, as described with respect to FIGS. 3A-3B.

In at least one embodiment, the method comprises, in response to the enable signal ENB, further generating a second delayed enable signal ENB2, wherein a first delay between a leading edge 341 of the first delayed enable signal ENB1 and a leading edge 335 of the enable signal ENB is greater than a second delay between a leading edge 337 of the second delayed enable signal ENB2 and the leading edge 335 of the enable signal ENB, as described with respect to FIGS. 3A-3B.

In at least one embodiment, the method comprises, prior to the leading edge 337 of the second delayed enable signal ENB2, electrically coupling the bit line BL to the ground voltage, e.g., through turned ON transistor MWT, rail NVSS, and turned ON switch MPD. Next, in response to the leading edge 335 of the second delayed enable signal ENB2, the bit line is caused to be floating, e.g., by turning OFF the switch MPD. Further, in response to the leading edge 341 of the first delayed enable signal ENB1, the voltage drop 345 on the bit line BL is generated by coupling the leading edge 341 of the first delayed enable signal ENB1 through the capacitor C, as described with respect to FIGS. 3A-3B. In at least one embodiment, one or more advantages described herein are achievable by the method 600B.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a memory device comprises a memory cell in a first power domain of a first power supply voltage, a bit line coupled to the memory cell, and a write assist circuit. The write assist circuit comprises an input, an output electrically couplable to the bit line in a write operation of the memory cell, an input circuit electrically coupled to the input, and an output circuit electrically coupled between the input circuit and the output. The input circuit is in a second power domain of a second power supply voltage different from the first power supply voltage, and the output circuit is in the first power domain.

In some embodiments, a write assist circuit for a memory array comprises an input, an output controllably couplable to a bit line of the memory array in a write operation, a capacitor, a switch, a first circuit, and a second circuit. The capacitor comprises a first terminal, and a second terminal electrically coupled to the output. The switch comprises a first terminal electrically coupled to receive a reference voltage, a second terminal electrically coupled to the output, and a control terminal. The first circuit comprises an input circuit electrically coupled to the input, and an output circuit electrically coupled between the input circuit and the first terminal of the capacitor. The second circuit is electrically coupled between the input and the control terminal of the switch. The output circuit is electrically coupled to receive a first power supply voltage. The input circuit is electrically coupled to receive a second power supply voltage different from the first power supply voltage.

In some embodiments, a method comprises, in a write operation of a memory cell electrically coupled to a word line and a bit line, applying an access voltage corresponding to a first power supply voltage to the word line. The method further comprises, in response to an enable signal corresponding to a second power supply voltage different from the first power supply voltage, pulling down a bit line voltage on the bit line by a voltage drop corresponding to the first power supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory cell in a first power domain of a first power supply voltage;
a bit line coupled to the memory cell; and
a write assist circuit comprising:
an input which is in a second power domain of a second power supply voltage different from the first power supply voltage,
an output electrically couplable to the bit line in a write operation of the memory cell,
a level shifter circuit having an input electrically coupled to the input of the write assist circuit, and an output in the first power domain, and
a capacitor having a first terminal directly coupled to the output of the level shifter circuit, and a second terminal directly coupled to the output of the write assist circuit,
wherein
the write assist circuit comprises a first circuit including the level shifter circuit, the first circuit having a first delay between the input of the write assist circuit and the capacitor,
the write assist circuit further comprises:
a switch electrically coupled between the output of the write assist circuit and a reference voltage, and
a second circuit electrically coupled between the input of the write assist circuit and a control terminal of the switch, the second circuit having a second delay smaller than the first delay,
the memory device further comprises a further switch having:
a first terminal directly coupled to the bit line,
a second terminal directly coupled to the output of the write assist circuit, and
a control terminal configured to receive a control signal,
the further switch is configured to, upon being turned ON by the control signal, electrically couple the bit line to the output of the write assist circuit in the write operation, and
the further switch is in the first power domain or in the second power domain.

2. The memory device of claim 1, wherein
the capacitor comprises a metal-insulator-metal (MIM) capacitor, which comprises:
the first terminal and the second terminal being conductive patterns correspondingly in two different metal layers physically over each other and also over the memory cell, and

a dielectric material in a dielectric layer between the two different metal layers.

3. The memory device of claim 1, wherein
the capacitor comprises a transistor including:
a source and a drain electrically coupled together and configuring one of the first terminal and the second terminal, and
a gate configuring the other of the first terminal and the second terminal, and the transistor is in the first power domain.

4. The memory device of claim 1, wherein
the second circuit and the switch are in the first power domain.

5. The memory device of claim 1, wherein
the second circuit and the switch are in the second power domain.

6. The memory device of claim 1, wherein
the level shifter circuit comprises first to third inverters, and first and second transistors of a first type,
the first and second transistors and transistors of the first type in the first and second inverters are in the first power domain of the first power supply voltage, and
the third inverter and transistors of a second type in the first and second inverters are in the second power domain of the second power supply voltage, the second type different from the first type.

7. The write assist circuit of claim 6, wherein
an input of the first inverter and an input of the third inverter configure the input of the level shifter circuit and are coupled to the input of the write assist circuit,
an output of the first inverter configures the output of the level shifter circuit, and
an output of the third inverter is electrically coupled to an input of the second inverter.

8. The write assist circuit of claim 7, wherein
the output of the first inverter is electrically coupled to a gate of the second transistor,
the output of the second inverter is electrically coupled to a gate of the first transistor,
the first transistor and the first inverter are electrically coupled in series between the first power supply voltage and a reference voltage, and
the second transistor and the second inverter are electrically coupled in series between the first power supply voltage and the reference voltage.

9. A write assist circuit for a memory array, the write assist circuit comprising:
an input;
an output controllably couplable to a bit line of the memory array in a write operation;
a capacitor comprising:
a first terminal, and
a second terminal electrically coupled to the output;
a switch comprising:
a first terminal electrically coupled to receive a reference voltage,
a second terminal electrically coupled to the output, and
a control terminal;
a first circuit comprising:
an input circuit electrically coupled to the input, and
an output circuit electrically coupled between the input circuit and the first terminal of the capacitor; and
a second circuit electrically coupled between the input and the control terminal of the switch, wherein the output circuit is electrically coupled to receive a first power supply voltage of a first power domain, the input circuit is electrically coupled to receive a second power supply voltage of a second power domain, the second power supply voltage different from the first power supply voltage, and the output circuit comprises an inverter having:

an input electrically coupled to the input circuit to receive a signal in the second power domain, and an output directly coupled to the first terminal of the capacitor to supply to the capacitor an inverted signal in the first power domain.

10. The write assist circuit of claim 9, wherein the first circuit is configured to have a first delay greater than a second delay of the second circuit.

11. The write assist circuit of claim 9, wherein the input circuit comprises a first inverter and a second inverter electrically coupled in series between the input of the write assist circuit and the input of the inverter of the output circuit, the first inverter and the second inverter electrically coupled to receive the second power supply voltage.

12. The write assist circuit of claim 9, wherein the input circuit comprises a level shifter circuit.

13. The write assist circuit of claim 12, wherein the level shifter circuit comprises first to third inverters, and first and second transistors of a first type, the first and second transistors and transistors of the first type in the first and second inverters are in a first power domain of the first power supply voltage, and the third inverter and transistors of a second type in the first and second inverters are in a second power domain of the second power supply voltage, the second type different from the first type.

14. The write assist circuit of claim 13, wherein an input of the first inverter and an input of the third inverter are coupled to the input of the write assist circuit, an output of the first inverter is electrically coupled to the input of the inverter of the output circuit, and an output of the third inverter is electrically coupled to an input of the second inverter.

15. The write assist circuit of claim 14, wherein the output of the first inverter is electrically coupled to a gate of the second transistor, the output of the second inverter is electrically coupled to a gate of the first transistor, the first transistor and the first inverter are electrically coupled in series between the first power supply voltage and a reference voltage, and the second transistor and the second inverter are electrically coupled in series between the first power supply voltage and the reference voltage.

16. The write assist circuit of claim 9, wherein the first power supply voltage is higher than the second power supply voltage.

17. A memory device, comprising:

a memory cell in a first power domain of a first power supply voltage;

a bit line coupled to the memory cell; and a write assist circuit comprising:

an input which is in a second power domain of a second power supply voltage different from the first power supply voltage, an output electrically couplable to the bit line in a write operation of the memory cell, a first circuit electrically coupled to the input of the write assist circuit, a capacitor electrically coupled between the first circuit and the output of the write assist circuit, a switch electrically coupled between the output of the write assist circuit and a reference voltage, and a second circuit electrically coupled between the input and a control terminal of the switch, wherein the first circuit comprises a level shifter circuit which comprises first to third inverters, and first and second transistors of a first type, the first and second transistors and transistors of the first type in the first and second inverters are in the first power domain of the first power supply voltage, and the third inverter and transistors of a second type in the first and second inverters are in the second power domain of the second power supply voltage, the second type different from the first type.

18. The memory device of claim 17, wherein an input of the first inverter and an input of the third inverter are coupled to the input of the write assist circuit, an output of the first inverter is electrically coupled to a terminal of the capacitor, an output of the third inverter is electrically coupled to an input of the second inverter, the output of the first inverter is electrically coupled to a gate of the second transistor, the output of the second inverter is electrically coupled to a gate of the first transistor, the first transistor and the first inverter are electrically coupled in series between the first power supply voltage and the reference voltage, and the second transistor and the second inverter are electrically coupled in series between the first power supply voltage and the reference voltage.

19. The memory device of claim 17, wherein the first power supply voltage is higher than the second power supply voltage.

20. The memory device of claim 17, wherein the first power supply voltage is lower than the second power supply voltage.

* * * * *